US012604694B2

(12) United States Patent
Hou

(10) Patent No.: US 12,604,694 B2
(45) Date of Patent: Apr. 14, 2026

(54) SEMICONDUCTOR DEVICE AND MANUFACTURING METHOD THEREOF

(71) Applicant: NANYA TECHNOLOGY CORPORATION, New Taipei (TW)

(72) Inventor: Szu Yu Hou, New Taipei (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 375 days.

(21) Appl. No.: 18/308,664

(22) Filed: Apr. 27, 2023

(65) Prior Publication Data

US 2024/0363330 A1     Oct. 31, 2024

(51) Int. Cl.
| | |
|---|---|
| *H01L 21/02* | (2006.01) |
| *H01L 21/311* | (2006.01) |
| *H01L 21/768* | (2006.01) |
| *H01L 23/532* | (2006.01) |

(52) U.S. Cl.
CPC .. *H01L 21/02068* (2013.01); *H01L 21/31138* (2013.01); *H01L 21/76814* (2013.01); *H01L 23/53257* (2013.01)

(58) Field of Classification Search
None
See application file for complete search history.

(56) References Cited

U.S. PATENT DOCUMENTS

| | | | | | |
|---|---|---|---|---|---|
| 6,492,245 | B1 * | 12/2002 | Liu | | H01L 21/7682 |
| | | | | | 438/421 |
| 11,239,111 | B1 * | 2/2022 | Huang | | H01L 21/76831 |

| | | | | | |
|---|---|---|---|---|---|
| 2015/0099344 | A1 * | 4/2015 | Kim | | H10B 12/34 |
| | | | | | 438/424 |
| 2023/0180462 | A1 * | 6/2023 | Chou | | H01L 21/76829 |
| | | | | | 257/296 |
| 2024/0339398 | A1 * | 10/2024 | Hsu | | H01L 23/528 |
| 2024/0339399 | A1 * | 10/2024 | Hsu | | H01L 21/7682 |

FOREIGN PATENT DOCUMENTS

| | | | | |
|---|---|---|---|---|
| CN | 112054027 | A * | 12/2020 | H10D 89/10 |
| CN | 115274665 | A | 11/2022 | |
| CN | 115623777 | A | 1/2023 | |
| CN | 117135914 | A * | 11/2023 | H10D 30/6728 |
| JP | 2014160712 | A * | 9/2014 | |
| KR | 102482369 | B1 * | 12/2022 | H01L 21/4885 |

OTHER PUBLICATIONS

Bayu Thedjoisworo et al., "Comparison of the effects of downstream H2- and O2-based plasmas on the removal of photoresist, silicon, and silicon nitride", 021206-1 J. Vac. Sci. Technol. B 31(2), Mar./Apr. 2013.

* cited by examiner

*Primary Examiner* — Michael Lebentritt
(74) *Attorney, Agent, or Firm* — CKC & Partners Co., LLC

(57)     ABSTRACT

A semiconductor device includes a substrate and a bit line structure disposed on the substrate. The bit line structure includes a first conductive structure and a second conductive structure, in which a material of the first conductive structure includes polysilicon. The second conductive structure is disposed in direct contact on the first conductive structure, in which a reactivity of a material of the second conductive structure to oxygen is larger than a reactivity of tungsten to oxygen.

15 Claims, 8 Drawing Sheets

1000

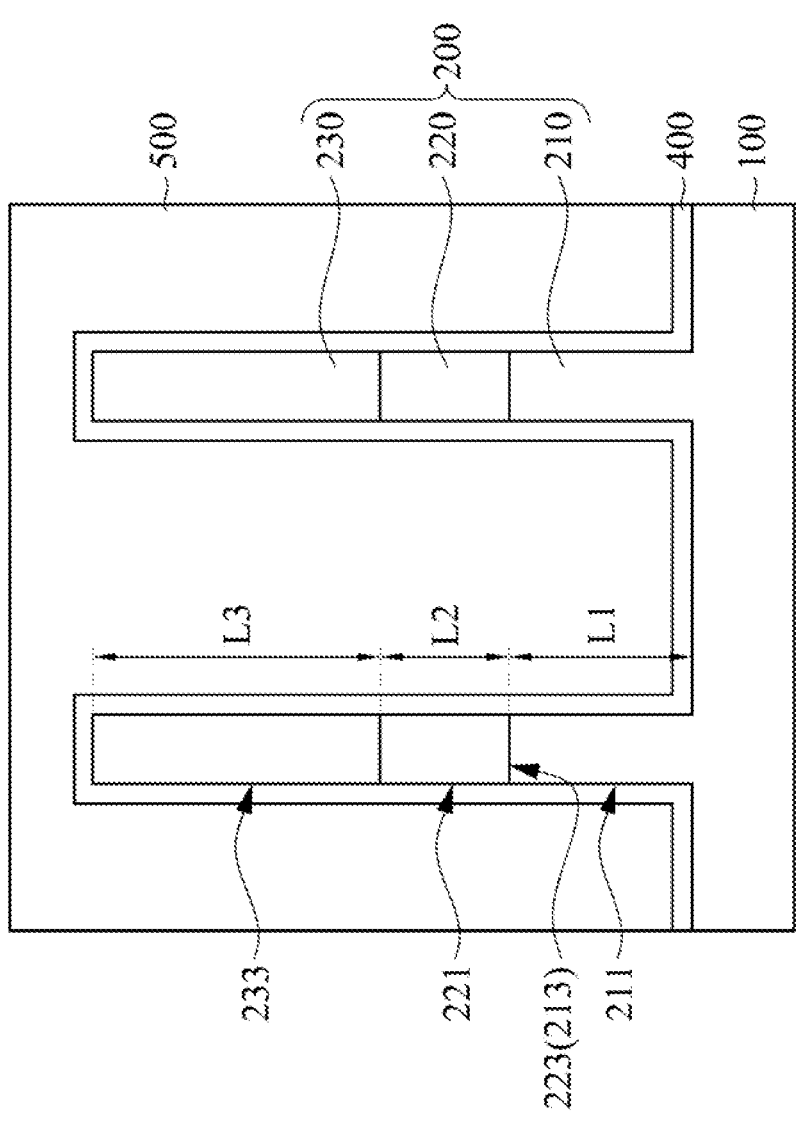
Fig. 1

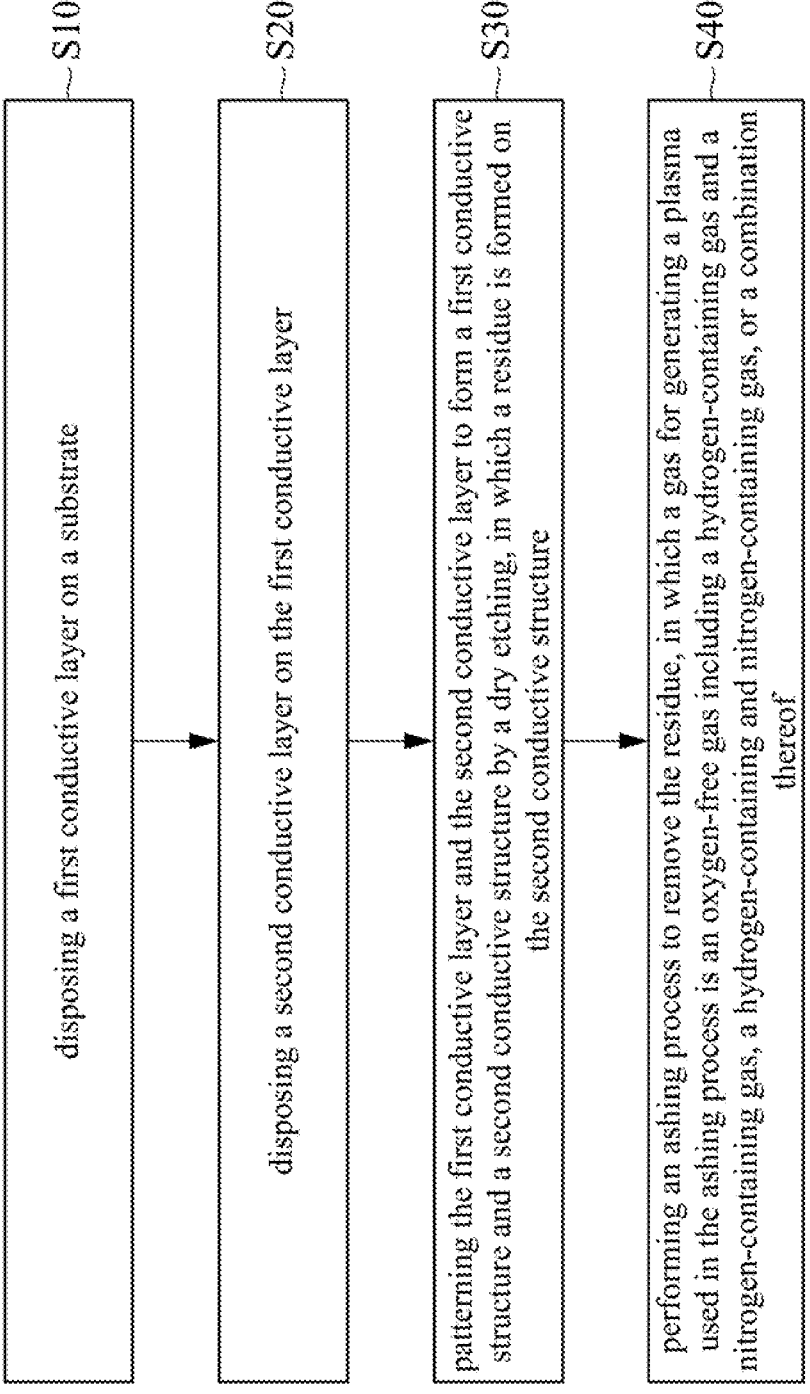

S10 disposing a first conductive layer on a substrate

S20 disposing a second conductive layer on the first conductive layer

S30 patterning the first conductive layer and the second conductive layer to form a first conductive structure and a second conductive structure by a dry etching, in which a residue is formed on the second conductive structure

S40 performing an ashing process to remove the residue, in which a gas for generating a plasma used in the ashing process is an oxygen-free gas including a hydrogen-containing gas and a nitrogen-containing gas, a hydrogen-containing gas, or a combination thereof

Fig. 2

SEMICONDUCTOR DEVICE AND MANUFACTURING METHOD THEREOF

BACKGROUND

Field of Invention

The present disclosure relates to a semiconductor device and a manufacturing method of a semiconductor device.

Description of Related Art

Semiconductor devices are used in a variety of electronic applications, such as personal computers, cellphones, digital cameras, and other electronic equipment. Semiconductor devices are typically fabricated by sequentially depositing insulating or dielectric layers, conductive layers, and semiconducting layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past.

Bit lines in the semiconductor device are paths for signal reading which are often used with the word lines to generate the address of each cell. In general, bit lines can be formed by a dry etching to be provided with high aspect ratio. However, dry etching often leads to problems such as electric migration failure to the bit lines. Therefore, how to optimize the process flow for manufacturing bit lines in the semiconductor device has become an important issue in this field.

SUMMARY

According to some embodiments of the present disclosure, a semiconductor device includes a substrate and a bit line structure disposed on the substrate. The bit line structure includes a first conductive structure and a second conductive structure, in which a material of the first conductive structure includes polysilicon. The second conductive structure is disposed in direct contact on the first conductive structure, in which a reactivity of a material of the second conductive structure to oxygen is larger than a reactivity of tungsten to oxygen.

In some embodiments of the present disclosure, a vertical length of the first conductive structure is larger than a vertical length of the second conductive structure.

In some embodiments of the present disclosure, the bit line structure further includes an insulating structure disposed in direct contact on the second conductive structure.

In some embodiments of the present disclosure, a material of the insulating structure includes silicon nitride.

In some embodiments of the present disclosure, a first sidewall of the first conductive structure and a second sidewall of the second conductive structure are substantially aligned with a third sidewall of the insulating structure.

In some embodiments of the present disclosure, the semiconductor device further includes a nitride spacer layer covering the second conductive structure and in direct contact with an entire sidewall of the second conductive structure.

According to some other embodiments of the present disclosure, a manufacturing method of a semiconductor device includes: disposing a first conductive layer on a substrate; disposing a second conductive layer on the first conductive layer; patterning the first conductive layer and the second conductive layer to form a first conductive structure and a second conductive structure by a dry etching, in which a residue is formed on the second conductive structure; and performing an ashing process to remove the residue, in which a gas for generating a plasma used in the ashing process is an oxygen-free gas comprising a hydrogen-containing gas and a nitrogen-containing gas, a hydrogen-containing and nitrogen-containing gas, or a combination thereof.

In some embodiments of the present disclosure, the hydrogen-containing and nitrogen-containing gas is diimide.

In some embodiments of the present disclosure, the hydrogen-containing and nitrogen-containing gas is ammonia.

In some embodiments of the present disclosure, the hydrogen-containing and nitrogen-containing gas is diimide and ammonia.

In some embodiments of the present disclosure, the hydrogen-containing gas is hydrogen gas, and the nitrogen-containing gas is nitrogen gas.

In some embodiments of the present disclosure, the dry etching is performed with argon plasma, such that the residue includes a polymer with carbon-carbon bonds and carbon-hydrogen bonds.

In some embodiments of the present disclosure, the manufacturing method of the semiconductor device further includes: disposing an insulating layer on the second conductive layer before performing the dry etching; and forming an insulating structure by patterning the insulating layer through the dry etching.

In some embodiments of the present disclosure, the residue is formed on a top surface of the insulating structure.

In some embodiments of the present disclosure, the manufacturing method of the semiconductor device further includes: forming a nitride spacer layer covering the first conductive structure, the second conductive structure, and the insulating structure, in which the nitride spacer layer is in contact with an entire sidewall of the second conductive structure.

According to the aforementioned embodiments of the present disclosure, since the ashing process is carried out with an oxygen-free gas, no oxidation reaction takes place during the ashing process. As such, the first conductive structure and the second conductive structure of the bit line structure can remain undamaged. As such, the interface resistance between the first conductive structure and the second conductive structure can be reduced, resulting in the overall low resistance of the semiconductor device.

BRIEF DESCRIPTION OF THE DRAWINGS

The disclosure can be more fully understood by reading the following detailed description of the embodiments, with reference made to the accompanying drawings as follows:

FIG. 1 is a cross-sectional view illustrating a semiconductor device according to some embodiments of the present disclosure;

FIG. 2 is a flowchart illustrating a manufacturing method of the semiconductor device shown in FIG. 1 according to some embodiments of the present disclosure;

DETAILED DESCRIPTION

Figure 3:
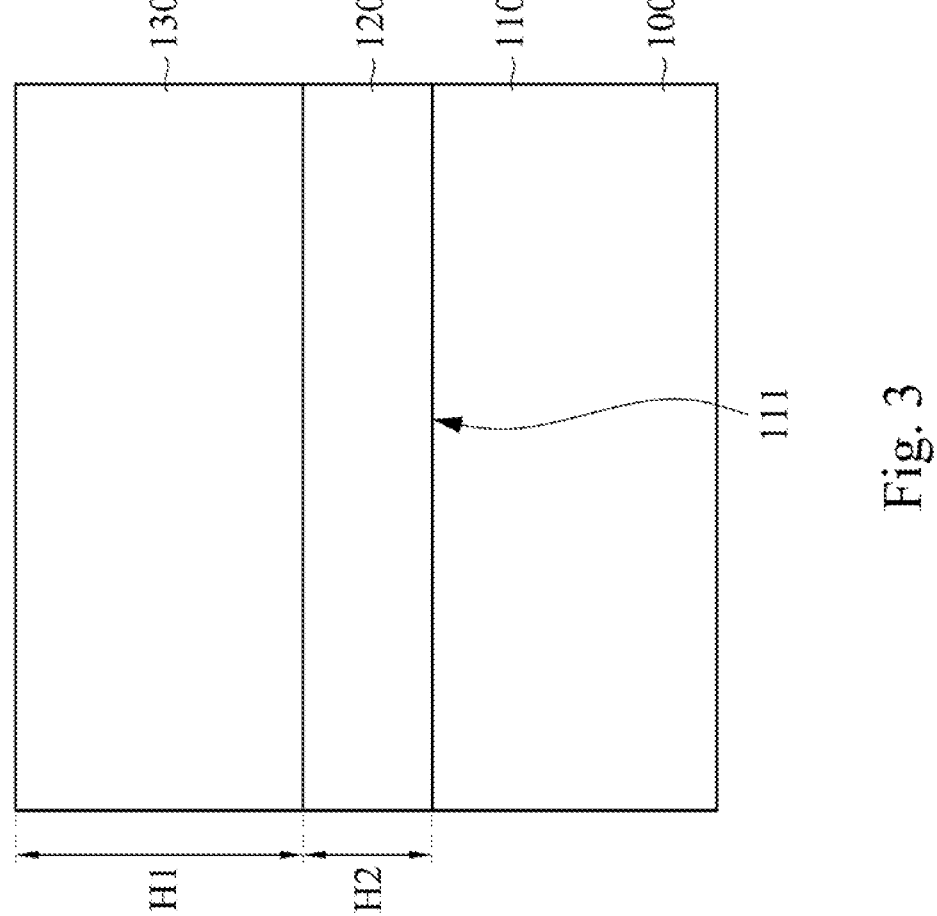
FIG. 3 to FIG. 7 are cross-sectional views illustrating a method of manufacturing the semiconductor device shown in FIG. 1 at various stages according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

Furthermore, relative terms such as "lower" or "bottom" and "upper" or "top" can be used herein to describe the relationship between one element and another element, as shown in the figure. It should be understood that relative terms are intended to include different orientations of the device other than those shown in the figures. For example, if the device in one figure is turned over, elements described as being on the "lower" side of other elements will be oriented on the "upper" side of the other elements. Therefore, the exemplary term "lower" may include an orientation of "lower" and "upper," depending on the specific orientation of the drawing. Similarly, if the device in one figure is turned over, elements described as "below" other elements will be oriented "above" the other elements. Therefore, the exemplary term "below" can include an orientation of "above" and "below."

In the present disclosure, a semiconductor device and a manufacturing method of the semiconductor device are provided. FIG. 1 is a cross-sectional view illustrating a semiconductor device 1000 according to some embodiments of the present disclosure. The semiconductor device 1000 includes a substrate 100 and a bit line structure 200 on the substrate 100. In is understood that, for the purpose of simplicity and clarity, the manufacturing method of the semiconductor device 1000 will be discussed in advance in the article.

FIG. 2 is a flowchart illustrating a manufacturing method of the semiconductor device 1000 shown in FIG. 1 according to some embodiments of the present disclosure. The manufacturing method of the semiconductor device 1000 includes the following steps. In step S10, a first conductive layer is disposed on a substrate. In step S20, a second conductive layer is disposed on the first conductive layer. In step S30, the first conductive layer and the second conductive layer are patterned to form a first conductive structure and a second conductive structure by a dry etching, in which a residue is formed on the second conductive structure. In step S40, an ashing process is performed to remove the residue, in which a gas for generating the plasma used in the ashing process is an oxygen-free gas including a hydrogen-containing gas and a nitrogen-containing gas, a hydrogen-containing and nitrogen-containing gas, or a combination thereof. The aforementioned steps will further be discussed in the following descriptions with the accompany of FIG. 3 to FIG. 7, which are cross-sectional views illustrating a method of manufacturing the semiconductor device 1000 shown in FIG. 1 at various stages according to some embodiments of the present disclosure.

Reference is made to FIG. 3. A substrate 100 is provided. Then, a first conductive layer 110 is disposed on the substrate 100. In some embodiments, the substrate 100 may include semiconductor materials such as silicon, germanium, silicon germanium, or combinations thereof, and the first conductive layer 110 may include polysilicon. In some other embodiments, the substrate 100 and the first conductive layer 110 are integrally formed as one piece, as shown in FIG. 3. In such embodiments, the substrate 100 and the first conductive layer 110 both include polysilicon. Then, a second conductive layer 120 is disposed on the first conductive layer 110. Specifically, the second conductive layer 120 is disposed on the entire surface 111 of the first conductive layer 110. In the present disclosure, a reactivity of the second conductive layer 120 to oxygen is larger than or equal to a reactivity of tungsten to oxygen. For example, the second conductive layer 120 may include tungsten. In the present disclosure, since the gas for generating the plasma during the subsequent ashing process is an oxygen-free gas, the second conductive layer 120 can be chosen from the above materials without being under the risk of oxidation, and this will be discussed later in more details.

In some embodiments, an insulating layer 130 is further disposed on the second conductive layer 120. In some embodiments, the insulating layer 130 may include silicon nitride. In some embodiments, a height H1 of the insulating layer 130 is larger than a height H2 of the second conductive layer 120. For example, the height H1 of the insulating layer 130 may be 2 times to 4 times the height H2 of the second conductive layer 120. In this way, the second conductive layer 120 can be protected from being oxidized during any possible exposure of oxygen (e.g., exposure of air), and the bit line structure formed subsequently can be provided with good electrical properties. In detail, if the height H1 of the insulating layer 130 is less than 2 times the height H2 of the second conductive layer 120, the second conductive layer 120 may be under the risk of being oxidized; an if the height H1 of the insulating layer 130 is more than 4 times the height H2 of the second conductive layer 120, the electrical properties of the bit line structure formed subsequently may be unstable.

Figure 4:
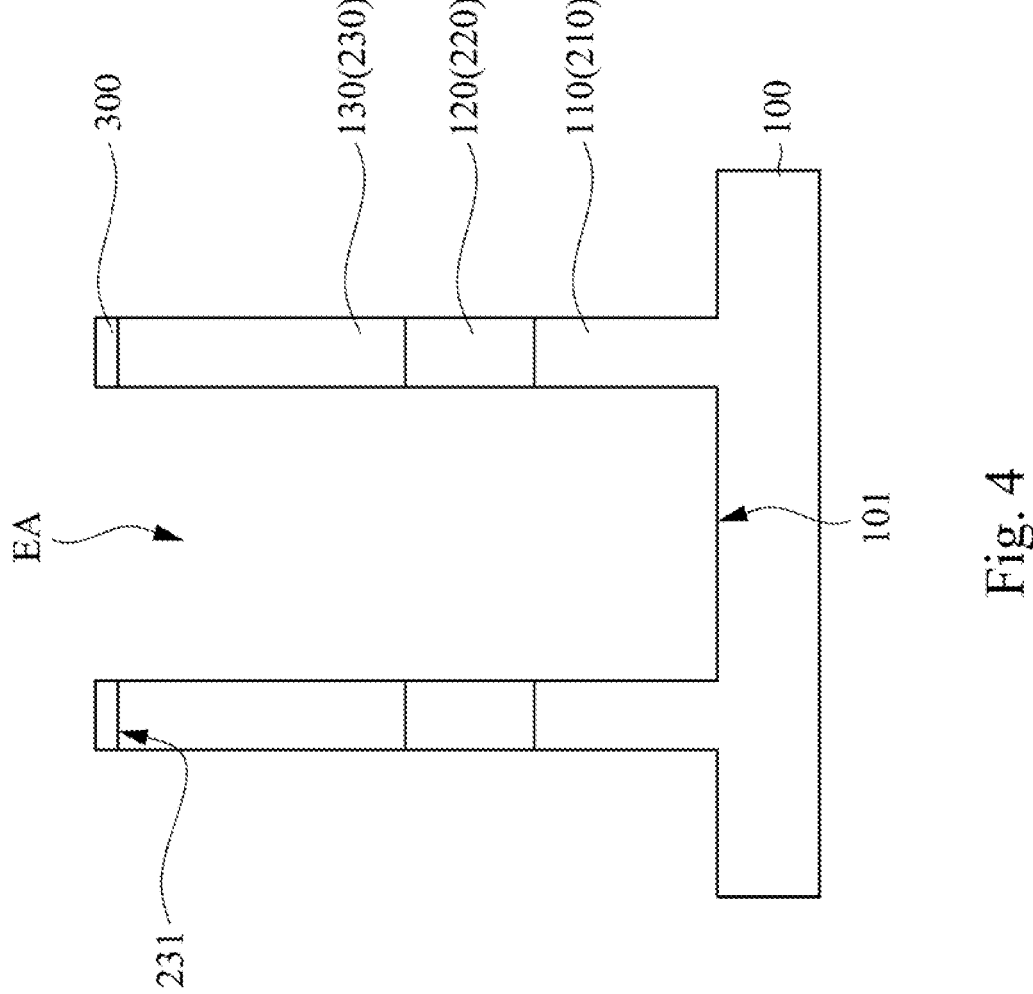

Reference is made to FIG. 4. A dry etching is then performed to pattern the first conductive layer 110, the second conductive layer 120, and the insulating layer 130, such that a first conductive structure 210, a second conductive structure 220, and the insulating structure 230 are formed. Since the first conductive structure 210, a second conductive structure 220, and the insulating structure 230 are respectively formed from the first conductive layer 110, the second conductive layer 120, and the insulating layer 130, the insulating structure 230 is disposed in direct contact on the second conductive structure 220, and the second conductive structure 220 is disposed in direct contact on the first conductive structure 210. In some embodiments, the dry etching is carried out with a hard mask and/or a photoresist (not shown in the figures) covering the non-etched area of the entire structure. In some embodiments, the dry etching is carried out by argon plasma, such that the first conductive layer 110, the second conductive layer 120, and the insulating layer 130 are partially etched to be patterned, and a portion of the substrate 100 that corresponds to the etched area EA is exposed. In some embodiments, when the first conductive layer 110 and the substrate 100 are integrally formed as one piece, the dry etching can be controlled by time, such that a portion of the first conductive layer 110 that corresponds to the etched area EA are fully etched, while a portion of the substrate 100 that corresponds to the etched area EA is exposed. In some embodiments, in order to ensure that the portion of first conductive layer 110 that corresponds to the etched area EA is fully removed, the portion of the substrate 100 that corresponds to the etched area EA can be over-etched.

After the dry etching is performed, a residue 300 is formed on the first conductive structure 210, the second conductive structure 220, and the insulating structure 230. More specifically, the residue 300 is formed on a top surface 231 of the insulating structure 230. In some other embodiments, when the hard mask and/or the photoresist are used during the dry etching, the residue 300 is formed on the hard mask and/or the photoresist, which is not shown in the figures. In still some other embodiments, the residue 300 may further be formed along sidewalls of the first conductive structure 210, the second conductive structure 220, and the insulating structure 230 as well as on a top surface 101 of the substrate 100, which is not shown in the figures. The residue 300 is formed due to the removal of the first conductive layer 110, the second conductive layer 120, and the insulating layer 130 that correspond to the etched area EA by the dry etching using the plasma mentioned above. In some embodiments, when the portion of the substrate 100 that corresponds to the etched area EA is over-etched, the residue 300 is formed due to the removal of the first conductive layer 110, the second conductive layer 120, the insulating layer 130, and the substrate 100 by the dry etching using the plasma mentioned above. In other words, the material of the residue 300 may be derived from the material of the first conductive layer 110, the second conductive layer 120, and the insulating layer 130, and in some embodiments, the material of the substrate 100.

Figure 5:
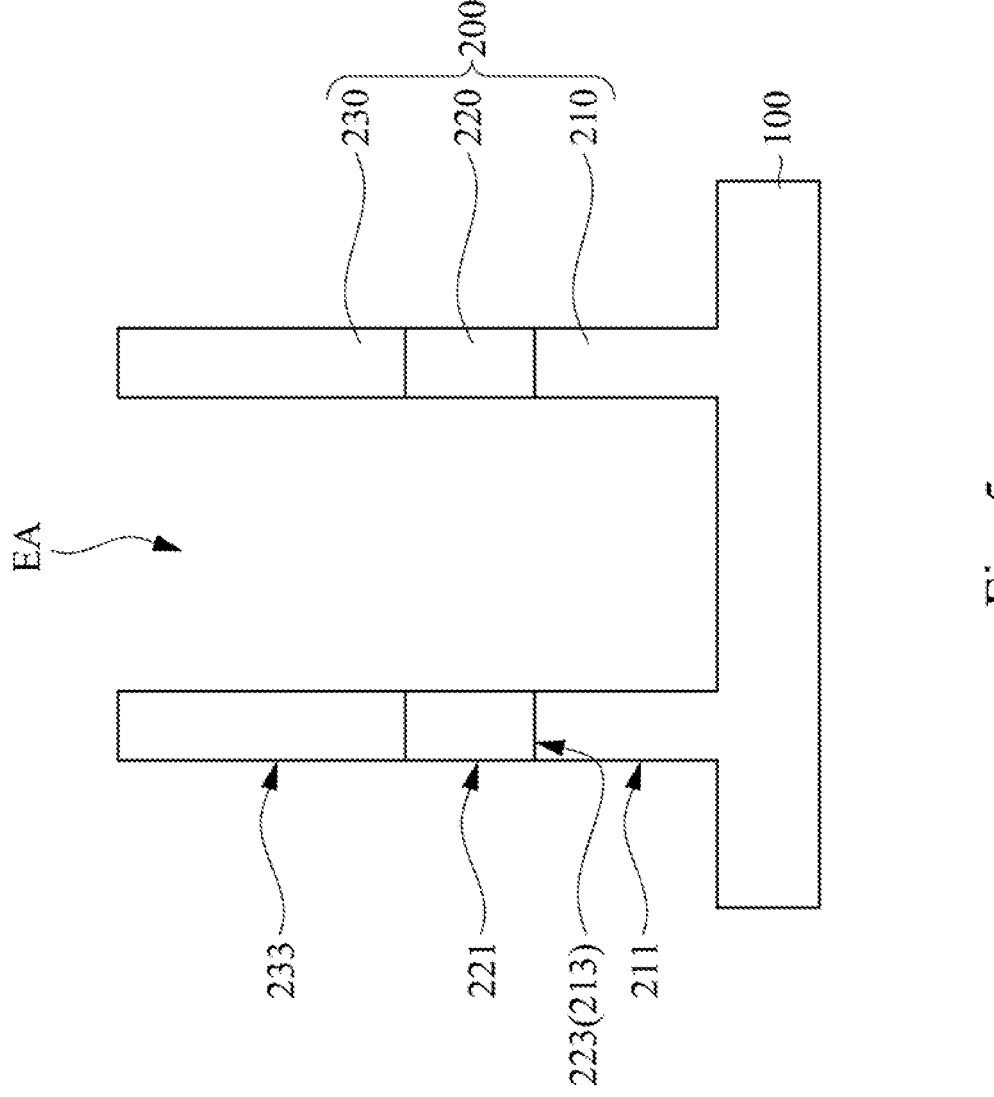
Figure 8:
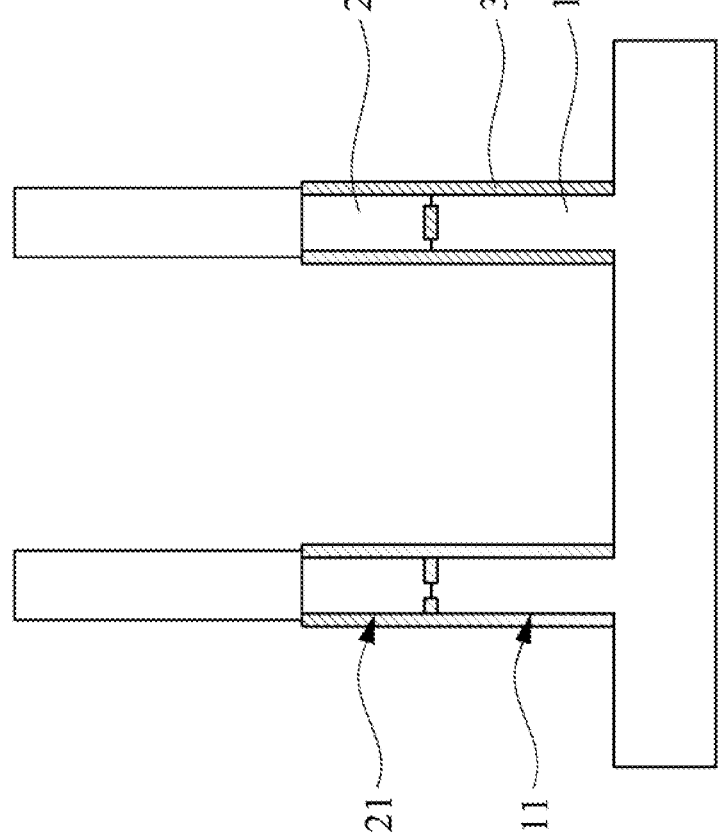
FIG. 8 is a cross-sectional view illustrating a method of manufacturing a conventional semiconductor device after an ashing process.

Reference is made to FIG. 5. An ashing process is then performed, such that the residue 300 (see FIG. 4) formed during the dry etching is removed. In the present disclosure, the ashing process is carried out with an oxygen-free gas. More specifically, the gas for generating the plasma during the ashing process is an oxygen-free gas. Since the ashing process is carried out with an oxygen-free gas, no oxidation reaction takes place during the ashing process. As such, the first conductive structure 210 and the second conductive structure 220 can remain undamaged (i.e., the first conductive structure 210 and the second conductive structure 220 can remain intact without being oxidized). In comparison, please refer to FIG. 8, which is a cross-sectional view illustrating a method of manufacturing a conventional semiconductor device after an ashing process. During the conventional ashing process which was carried out with an oxygen-based gas, a sidewall 11 of the first conductive structure 1 and a sidewall 21 of the second conductive structure 2 were oxidized since the oxygen radical formed by the oxygen-based gas attacked the first conductive structure 1 and the second conductive structure 2. In addition, the oxygen radical formed by the oxygen-based gas further penetrated between the first conductive structure 1 and the second conductive structure 2; therefore, the interface of the first conductive structure 1 and the second conductive structure 2 was also oxidized. As a result, an oxidation layer 3 was formed on the sidewall 11 of the first conductive structure 1, the sidewall 21 of the second conductive structure 2, and between the first conductive structure 1 and the second conductive structure 2, as shown in FIG. 8.

However, please refer back to FIG. 5, since in the present disclosure, no oxidation reaction takes place during the ashing process, the second sidewall 221 of the second conductive structure 220 and the first sidewall 211 of the first conductive structure 210 are substantially aligned with a third sidewall 233 of the insulating structure 230, and an bottom surface 223 of the second conductive structure 220 is directly in contact with an upper surface 213 of the first conductive structure 210. That is, no oxidation layer is formed on the second sidewall 221 of the second conductive structure 220 and the first sidewall 211 of the first conductive structure 210 and between the first conductive structure 210 and the second conductive structure 220. As a result, the interface resistance between the first conductive structure 210 and the second conductive structure 220 can be reduced, resulting in the overall low resistance of the semiconductor device. In addition, the first sidewall 211 of the first conductive structure 210, the second sidewall 221 of the second conductive structure 220, and the third sidewall 233 of the insulating structure 230 are substantially straight. In some embodiments, when the portion of the substrate 100 that corresponds to the etched area EA is over-etched during the dry etching, the substrate 100 that is right below the first conductive structure 210 has a sidewall (not shown) substantially aligned with the first sidewall 211 of the first conductive structure 210. As a supplementary note, since no oxidation layer is formed between the first conductive structure 210 and the second conductive structure 220, there is no need for the design of the diffusion barrier metals (such as titanium, tungsten nitride, tungsten silicide, etc.) between the first conductive structure 210 and the second conductive structure 220.

In the present disclosure, the oxygen-free gas used in the ashing process includes a hydrogen-containing gas and a nitrogen-containing gas, a hydrogen-containing and nitrogen-containing gas, or a combination thereof. In some embodiments, hydrogen-containing and nitrogen-containing gas may be diimide ($H_2N_2$) or ammonia ($NH_3$). In some embodiments, the hydrogen-containing gas is hydrogen gas ($H_2$), and the nitrogen-containing gas is nitrogen gas ($N_2$). The hydrogen radical derived from the oxygen-free gas can react with the residue 300 without oxidize the first conductive structure 210 and the second conductive structure 220, such that the residue 300 can be entirely removed without damaging the first conductive structure 210 and the second conductive structure 220. In some preferred embodiments, in order to achieve a better effect in removing the residue 300, the oxygen-free gas may be diimide. In some embodiments, when the dry etching is carried out with the hard mask and/or the photoresist, the hard mask and/or the photoresist can be removed through the ashing process as well. Furthermore, compared with the conventional ashing process which was carried out with an oxygen-based gas, the ashing process in the present disclosure can provide an enhanced ash rate with a lower concentration of the gas that is used to generate plasma in the ashing process. After the ashing process, a bit line structure 200 including the first conductive structure 210, the second conductive structure 220, and the insulating structure 230 is formed. In some embodiments, a plurality of the bit line structures 200 may be simultaneously formed at intervals and equidistantly. As a result, a plurality of the bit line structures 200 is formed on the substrate 100 for signal reading.

Figure 6:
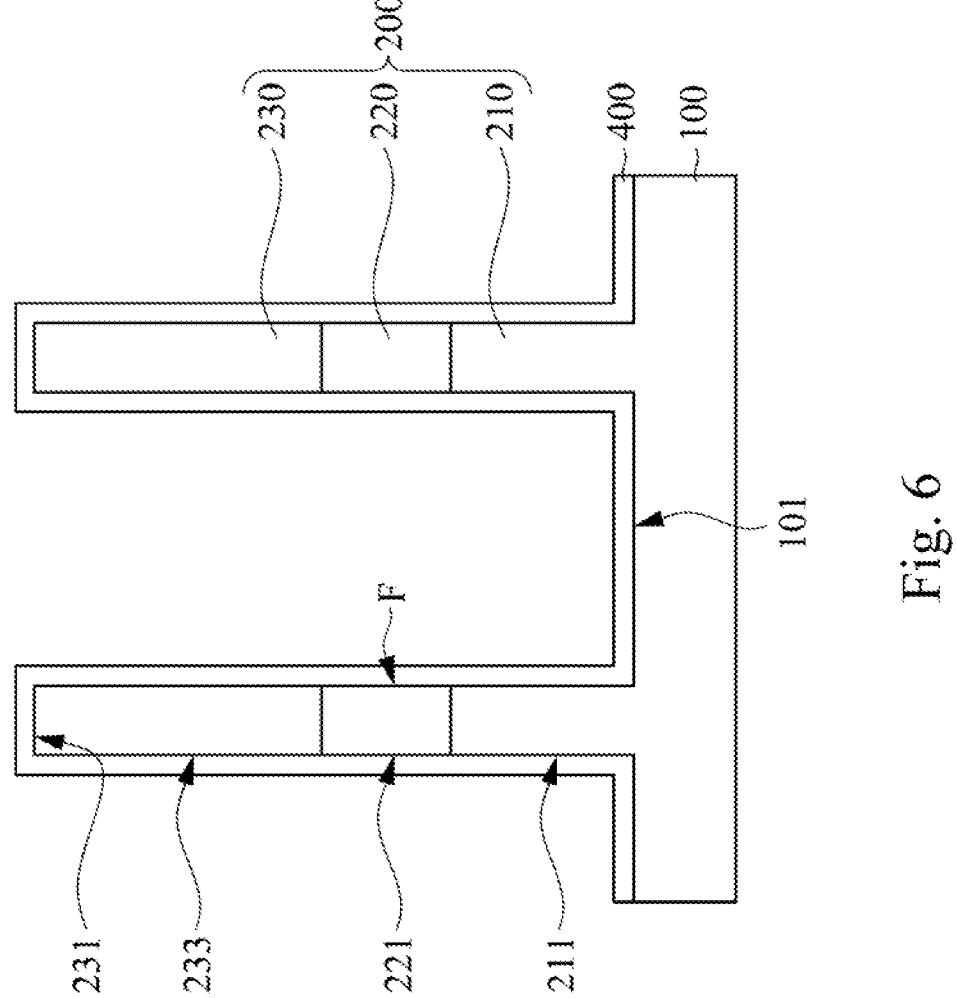
Figure 7:
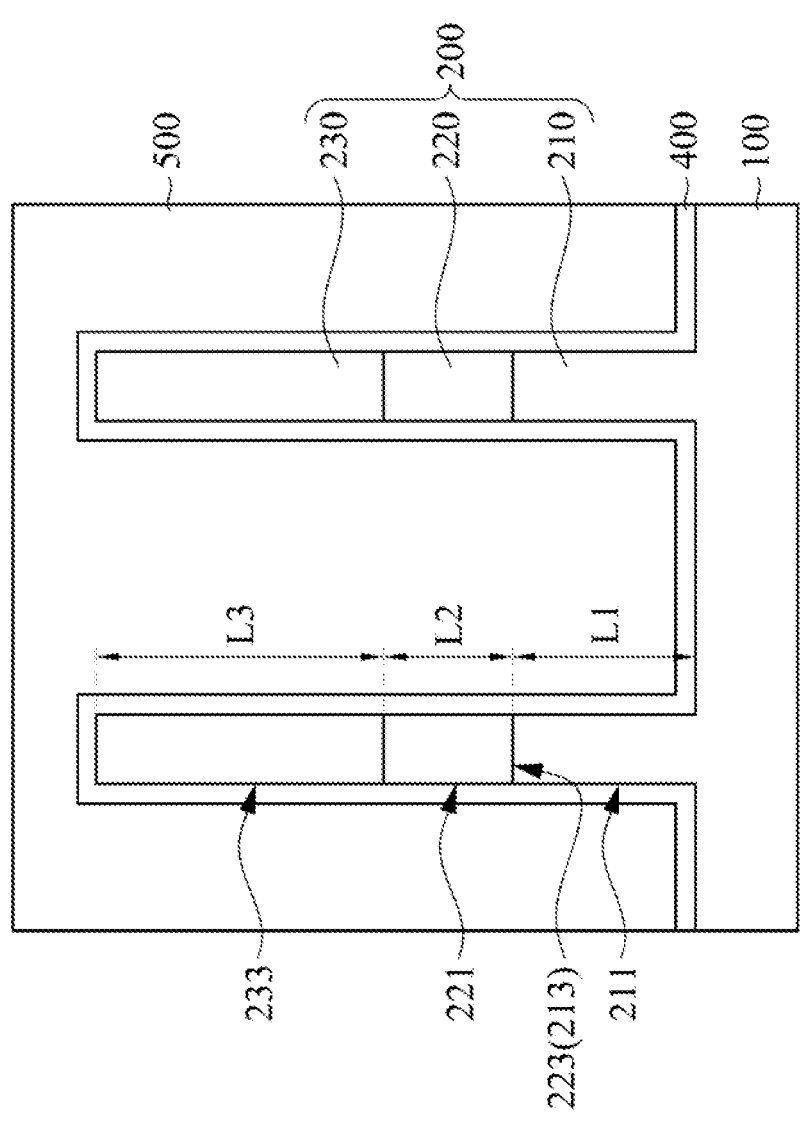

Reference is made to FIG. 6. A nitride spacer layer 400 is then formed to cover the bit line structure 200 and in direct contact with an entire sidewall of the bit line structure 200. In detail, the nitride spacer layer 400 covers the first conductive structure 210, the second conductive structure 220, and the insulating structure 230, and is in contact with an entire first sidewall 211 of the first conductive structure 210, an entire second sidewall 221 of the second conductive structure 220, and an entire third sidewall 233 of the insulating structure 230. In some embodiments, the nitride spacer layer 400 covers the first conductive structure 210, the second conductive structure 220, and the insulating structure 230 in conformal. In some embodiments, the nitride spacer layer 400 may further cover the top surface 101 of the substrate 100. In addition, no oxidation layer is formed between the nitride spacer layer 400 and the second sidewall 221 of the second conductive structure 220, the first sidewall 211 of the first conductive structure 210, and the third sidewall 233 of the insulating structure 230. As mentioned above, the second sidewall 221 of the second conductive structure 220, the first sidewall 211 of the first conductive structure 210, and the third sidewall 233 of the insulating structure 230 are substantially aligned with each other; therefore, an interface F between the nitride spacer layer 400 and the first sidewall 211 of the first conductive structure 210, the second sidewall 221 of the second conductive structure 220, and the third sidewall 233 of the insulating structure 230 is substantially straight. Reference is made to FIG. 7. An interlayer dielectric 500 is formed over the substrate 100 and covering the nitride spacer layer 400 and the bit line structure(s) 200. In some embodiments, a material of the interlayer dielectric 500 may be, for example, silicon nitride.

After the above steps, the semiconductor device 1000 of the present is obtained. In detail, the semiconductor device 1000 includes a substrate 100 and at least one bit line structure 200 on the substrate 100. The bit line structure 200 includes a first conductive structure 210 and a second conductive structure 220 disposed on the first conductive structure 210. In some embodiments, the bit line structure 200 further includes an insulating structure 230 disposed on the second conductive structure 220. In some embodiments, the semiconductor device 1000 further includes a nitride spacer layer 400 and an interlayer dielectric 500, in which the nitride spacer layer 400 is disposed over the substrate 100 to cover the bit line structure(s) 200 in conformal and in direct contact with an entire sidewall of the bit line structure (s) 200, and the interlayer dielectric 500 is disposed over the substrate 100 and covering the nitride spacer layer 400 and the bit line structure(s) 200. In some embodiments, a material of the first conductive structure 210 may include polysilicon. In some embodiments, the insulating structure 230 may include silicon nitride.

As mentioned above, since the gas for generating the plasma during the ashing process is an oxygen-free gas, the material of the second conductive structure 220 (i.e., the material of the second conductive layer 120) can be chosen from the materials that have a reactivity to oxygen higher than or equal to a reactivity of tungsten to oxygen. In some embodiments, the material of the second conductive structure 220 may be a metal such as tungsten. In addition, since no oxidation reaction takes place during the ashing process, a first sidewall 211 of the first conductive structure 210 and a second sidewall 221 of the second conductive structure 220 are substantially aligned with a third sidewall 233 of the insulating structure 230, and the second conductive structure 220 is directly in contact with the first conductive structure 210. For example, a bottom surface 223 of the second conductive structure 220 is directly in contact and coplanar with a top surface 213 of the first conductive structure 210.

In some embodiments, a vertical length L3 of the insulating structure 230 is larger than a vertical length L2 of the second conductive structure 220. For example, the vertical length L3 of the insulating structure 230 may be 2 times to 4 times the vertical length L2 of the second conductive structure 220. In this way, during the manufacturing process of the semiconductor device 1000, the second conductive layer 120 can be protected from being oxidized during any possible exposure of oxygen, and the bit line structure 200 can be provided with good electrical properties. In some embodiments, a vertical length L1 of the first conductive structure 210 is larger than the vertical length L2 of the second conductive structure 220. In this way, the bit line structure 200 can be provided with good electrical properties, and the efficiency of the ashing process carried out with the oxygen-free gas can be enhanced.

According to the aforementioned embodiments of the present disclosure, since the ashing process is carried out with an oxygen-free gas, no oxidation reaction takes place during the ashing process. As such, the first conductive structure and the second conductive structure of the bit line structure can remain undamaged. As such, the interface resistance between the first conductive structure and the second conductive structure can be reduced, resulting in the overall low resistance of the semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A semiconductor device, comprising:
   a substrate; and
   a bit line structure disposed on the substrate and comprising:
   a first conductive structure, wherein a material of the first conductive structure comprises polysilicon; and
   a second conductive structure disposed in direct contact on the first conductive structure, wherein a reactivity of a material of the second conductive structure to oxygen is larger than a reactivity of tungsten to oxygen.

2. The semiconductor device of claim 1, wherein a vertical length of the first conductive structure is larger than a vertical length of the second conductive structure.

3. The semiconductor device of claim 1, wherein the bit line structure further comprises:
   an insulating structure disposed in direct contact on the second conductive structure.

4. The semiconductor device of claim 3, wherein a material of the insulating structure comprises silicon nitride.

5. The semiconductor device of claim 3, wherein a first sidewall of the first conductive structure and a second sidewall of the second conductive structure are substantially aligned with a third sidewall of the insulating structure.

6. The semiconductor device of claim 1, further comprising:
   a nitride spacer layer covering the second conductive structure and in direct contact with an entire sidewall of the second conductive structure.

7. A manufacturing method of a semiconductor device, comprising:
   disposing a first conductive layer on a substrate;
   disposing a second conductive layer on the first conductive layer;

patterning the first conductive layer and the second conductive layer to form a first conductive structure and a second conductive structure by a dry etching, wherein a residue is formed on the second conductive structure; and performing an ashing process to remove the residue, wherein a gas for generating a plasma used in the ashing process is an oxygen-free gas comprising a hydrogen-containing gas and a nitrogen-containing gas, a hydrogen-containing and nitrogen-containing gas, or a combination thereof.

8. The manufacturing method of the semiconductor device of claim 7, wherein the hydrogen-containing and nitrogen-containing gas is diimide.

9. The manufacturing method of the semiconductor device of claim 7, wherein the hydrogen-containing and nitrogen-containing gas is ammonia.

10. The manufacturing method of the semiconductor device of claim 7, wherein the hydrogen-containing and nitrogen-containing gas is diimide and ammonia.

11. The manufacturing method of the semiconductor device of claim 7, wherein the hydrogen-containing gas is hydrogen gas, and the nitrogen-containing gas is nitrogen gas.

12. The manufacturing method of the semiconductor device of claim 7, wherein the dry etching is performed with argon plasma, such that the residue comprises a polymer with carbon-carbon bonds and carbon-hydrogen bonds.

13. The manufacturing method of the semiconductor device of claim 7, further comprising:

disposing an insulating layer on the second conductive layer before performing the dry etching; and forming an insulating structure by patterning the insulating layer through the dry etching.

14. The manufacturing method of the semiconductor device of claim 13, wherein the residue is formed on a top surface of the insulating structure.

15. The manufacturing method of the semiconductor device of claim 13, further comprising:

forming a nitride spacer layer covering the first conductive structure, the second conductive structure, and the insulating structure, wherein the nitride spacer layer is in contact with an entire sidewall of the second conductive structure.

* * * * *